(12) United States Patent
Wang et al.

(10) Patent No.: US 8,441,264 B2
(45) Date of Patent: May 14, 2013

(54) STATION FOR DETECTING WINDING PRODUCTS AND METHOD FOR DETECTING INTER-TURN SHORT CIRCUIT

(75) Inventors: Chun-Chieh Wang, Taipei County (TW); Yu-Liang Chung, Taipei (TW); Yong-Lin Kuo, Taipei (TW); Lai-Sheng Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 639 days.

(21) Appl. No.: 12/638,963

(22) Filed: Dec. 15, 2009

(65) Prior Publication Data

US 2011/0089954 A1    Apr. 21, 2011

(30) Foreign Application Priority Data

Oct. 16, 2009    (TW) ................................ 98135134 A

(51) Int. Cl.
*G01R 31/06*    (2006.01)
(52) U.S. Cl.
USPC ........... 324/546; 324/510; 324/547; 324/545; 324/555; 324/509; 324/765.01; 361/20; 361/35; 361/38
(58) Field of Classification Search .................. 324/510, 324/546, 547, 545, 555, 509, 765.01; 361/20, 361/35, 38
See application file for complete search history.

(56) References Cited

U.S. PATENT DOCUMENTS

| | | | | |
|---|---|---|---|---|
| 4,133,017 A | * | 1/1979 | Johnson et al. | 361/42 |
| 5,510,726 A | * | 4/1996 | Brady | 324/545 |
| 5,659,232 A | * | 8/1997 | Benning | 318/438 |
| 5,691,643 A | * | 11/1997 | Ishiguro et al. | 324/510 |
| 5,907,244 A | * | 5/1999 | Crabill et al. | 324/546 |
| 5,949,247 A | * | 9/1999 | Lima et al. | 324/765.01 |
| 6,049,196 A | * | 4/2000 | Arai et al. | 322/61 |
| 6,177,801 B1 | | 1/2001 | Chong | |
| 6,369,582 B2 | * | 4/2002 | Coffeen | 324/547 |
| 6,549,017 B2 | * | 4/2003 | Coffeen | 324/547 |
| 6,593,751 B2 | * | 7/2003 | Takahashi | 324/551 |
| 6,636,823 B1 | | 10/2003 | Unsworth et al. | |
| 6,862,558 B2 | * | 3/2005 | Huang | 702/194 |

(Continued)

FOREIGN PATENT DOCUMENTS

| | | |
|---|---|---|
| CN | 1184367 | 6/1998 |
| KR | 10-0873181 | 12/2008 |

(Continued)

OTHER PUBLICATIONS

"First Office Action of China Counterpart Application", issued on Jun. 20, 2012, p. 1-p. 4.

(Continued)

*Primary Examiner* — Patrick Assouad
*Assistant Examiner* — Lamarr Brown
(74) *Attorney, Agent, or Firm* — Jianq Chyun IP Office

(57) ABSTRACT

A detecting station of a winding product and a method for detecting an inter-turn short circuit are provided. The method includes following steps. First, a high voltage pulse is input to two ends of a winding of a winding product. Next, a voltage value of an electrifying process of the winding is extracted for generating an extracting data. Finally, a time-frequency converting operation is performed to the extracting data, and a time-frequency analysis information is generated for indicating whether or not the inter-turn short circuit is occurred in the winding.

10 Claims, 6 Drawing Sheets

U.S. PATENT DOCUMENTS

| | | | |
|---|---|---|---|
| 6,911,838 B2 | 6/2005 | Rao et al. | |
| 7,102,379 B2* | 9/2006 | Hobelsberger et al. | 324/765.01 |
| 7,253,634 B1* | 8/2007 | Kasztenny et al. | 324/510 |
| 7,411,404 B2 | 8/2008 | Rai | |
| 7,956,637 B2* | 6/2011 | Lu et al. | 324/765.01 |
| 2001/0038290 A1* | 11/2001 | Coffeen | 324/547 |
| 2002/0070621 A1* | 6/2002 | Mori et al. | 310/215 |
| 2003/0033094 A1* | 2/2003 | Huang | 702/39 |
| 2005/0200378 A1* | 9/2005 | Hobelsberger et al. | 324/772 |
| 2006/0001392 A1* | 1/2006 | Ajima et al. | 318/432 |
| 2006/0125513 A1* | 6/2006 | de Larminat et al. | 324/772 |
| 2008/0042683 A1* | 2/2008 | Kasztenny et al. | 324/772 |
| 2008/0084229 A1* | 4/2008 | Frommer et al. | 324/772 |
| 2008/0252266 A1* | 10/2008 | Bolz et al. | 320/166 |
| 2008/0303543 A1* | 12/2008 | Cop | 324/772 |
| 2009/0033357 A1* | 2/2009 | Lindsey et al. | 324/772 |
| 2009/0107256 A1* | 4/2009 | Jensen | 73/862 |
| 2009/0179605 A1* | 7/2009 | Kanekawa et al. | 318/490 |
| 2010/0231229 A1* | 9/2010 | Harris et al. | 324/547 |
| 2010/0271038 A1* | 10/2010 | Blakely | 324/509 |
| 2010/0290164 A1* | 11/2010 | Kinsel | 361/45 |
| 2011/0018727 A1* | 1/2011 | Bharadwaj et al. | 340/648 |
| 2011/0031980 A1* | 2/2011 | Kruger et al. | 324/547 |
| 2011/0080177 A1* | 4/2011 | Beck et al. | 324/509 |
| 2011/0221600 A1* | 9/2011 | Kinsel et al. | 340/650 |
| 2011/0222194 A1* | 9/2011 | Kinsel et al. | 361/42 |
| 2011/0241723 A1* | 10/2011 | Abel et al. | 324/765.01 |
| 2011/0260748 A1* | 10/2011 | Lee et al. | 324/765.01 |
| 2011/0267072 A1* | 11/2011 | Zhao | 324/547 |
| 2011/0304339 A1* | 12/2011 | Schumacher et al. | 324/509 |
| 2011/0304351 A1* | 12/2011 | Cop | 324/765.01 |
| 2012/0112757 A1* | 5/2012 | Vrankovic et al. | 324/509 |
| 2012/0113555 A1* | 5/2012 | Mousavi et al. | 361/78 |
| 2012/0119751 A1* | 5/2012 | Scott et al. | 324/509 |
| 2012/0139555 A1* | 6/2012 | Mayfield et al. | 324/547 |

FOREIGN PATENT DOCUMENTS

| | | |
|---|---|---|
| TW | 254441 | 8/1995 |
| TW | 295628 | 1/1997 |
| TW | 306626 | 5/1997 |
| TW | 200616328 | 5/2006 |
| TW | 200634465 | 10/2006 |
| TW | I269878 | 1/2007 |

OTHER PUBLICATIONS

"Office Action of Taiwan counterpart application" issued on Oct. 24, 2012, p. 1-p. 6.

* cited by examiner

STATION FOR DETECTING WINDING PRODUCTS AND METHOD FOR DETECTING INTER-TURN SHORT CIRCUIT

CROSS-REFERENCE TO RELATED APPLICATION

This application claims the priority benefit of Taiwan application serial no. 98135134, filed on Oct. 16, 2009. The entirety of the above-mentioned patent application is hereby incorporated by reference herein and made a part of specification.

BACKGROUND OF THE INVENTION

1. Field of the Invention

The present invention relates to a technique for detecting an inter-turn short circuit, more particularly, to a technique for detecting an inter-turn short circuit in a winding product.

2. Description of Related Art

There is a plurality of winding products in the market, for example, motors, transformers, etc. During a fabrication process of the winding product, scratching, breaking and chapping of an enameled film of a winding thereof are inevitable. Moreover, regarding devices with high using voltages, such as a high voltage ignition coil, an LCD inverter, an isolated flyback DC-DC converter, etc., after a period of utilization, spark discharges are probably generated due to inadequate isolation of the enameled wires, which may even cause a damage of the whole device. Therefore, it is a very important technique to detect whether or not an inter-turn short circuit is occurred in the winding of the winding product.

In the conventional technique, though a general inductance/capacitance/resistance LCR meter can measure electrical characteristics of a device, since a detecting voltage thereof is very low, the inter-turn short circuit phenomenon of the winding cannot be detected. Moreover, though a general Hi-pot tester can exert a high voltage to both ends of the winding, such method takes the winding as a load, which may cause more damage.

Moreover, when the motor is rotated, a current or a voltage signal of the motor is opportunely measured, and a power decomposition technique is used to obtain a negative sequence current. Then, a theoretical negative sequence current caused by unbalance of the motor itself is calculated, and after a deduction operation, a remained current value is caused by the inter-turn short circuit. However, according to such method, errors are generated during calculation and actual measurement.

Accordingly, a detecting technique using a pulse resonance is developed. Presently, the technique of detecting whether or not the inter-turn short circuit is occurred in the winding of the winding product according to the pulse resonance is regarded as the safest and the most reliable technique. Regarding a current pulse resonance tester, it first detects a voltage signal of the winding of the normal winding product to serve as a comparison party, and then measures a voltage signal of a winding of another winding product. Then, the measured voltage signal is compared to the voltage signal serving as the comparison party to determine whether or not the winding of the winding product to be detected is normal.

However, in the conventional technique, when an abnormal winding product is detected, a difference between the voltage signal of the abnormal winding product and the voltage signal measured from the normal winding product is probably tiny, and even cannot be distinguished by naked eyes. Therefore, in the conventional technique, an experienced inspector is required for determining whether or not the inter-turn short circuit is occurred in the winding. In other words, the conventional technique cannot be widespread, and a lot of human labour and cost are spent. Moreover, since the difference between the voltage signals is very tiny, during an inspection process of a large quantity of products, it can be carelessly neglected, which may lead to a result that the bad products pass through the inspection.

SUMMARY OF THE INVENTION

Accordingly, the present invention is directed to a detecting station of a winding product, which can use a simple system to safely and reliably detect whether or not an inter-turn short circuit is occurred in a winding of the winding product.

The present invention is also directed to a method for detecting an inter-turn short circuit, by which whether or not an inter-turn short circuit is occurred in a winding of the winding product can be accurately determined without using a comparison party.

The present invention provides a detecting station of a winding product, which includes a pulse generating module, an extracting module and a time-frequency analysis module. The pulse generating module is coupled to the winding product to input a high voltage pulse to two ends of a winding of the winding product. Moreover, the extracting module extracts a voltage value of an electrifying process of the winding according to a voltage shunt approach, and generates an extracting data to the time-frequency analysis module. The time-frequency analysis module performs a time-frequency converting operation to the extracting data to obtain a time-frequency analysis information indicating whether or not the inter-turn short circuit is occurred in the winding of the winding product.

The present invention provides a method for detecting an inter-turn short circuit, and the method includes following steps. First, a high voltage pulse is input to two ends of a winding of a winding product. Next, a voltage value of an electrifying process of the winding is extracted for generating an extracting data. Finally, a time-frequency converting operation is performed to the extracting data, and a time-frequency analysis information is generated for indicating whether or not the inter-turn short circuit is occurred in the winding.

According to the above descriptions, in the present invention, the time-frequency analysis information is obtained by performing the time-frequency converting operation to the extracting data, so as to determine whether or not the inter-turn short circuit is occurred in the winding. Therefore, in the present invention, the inter-turn short circuit of the winding product can be safely and accurately detected without performing complicated operations to increase a hardware cost.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Since it is a hard to determine whether or not a inter-turn short circuit is occurred in a winding by only measuring a voltage signal generated by a voltage value of an electrifying process of the winding, in the present invention, the voltage signal extracted from the winding is spread in a time domain, so as to determine whether or not the inter-turn short circuit is occurred, and a detailed description thereof is described below with reference of corresponding figures.

Figure 1:
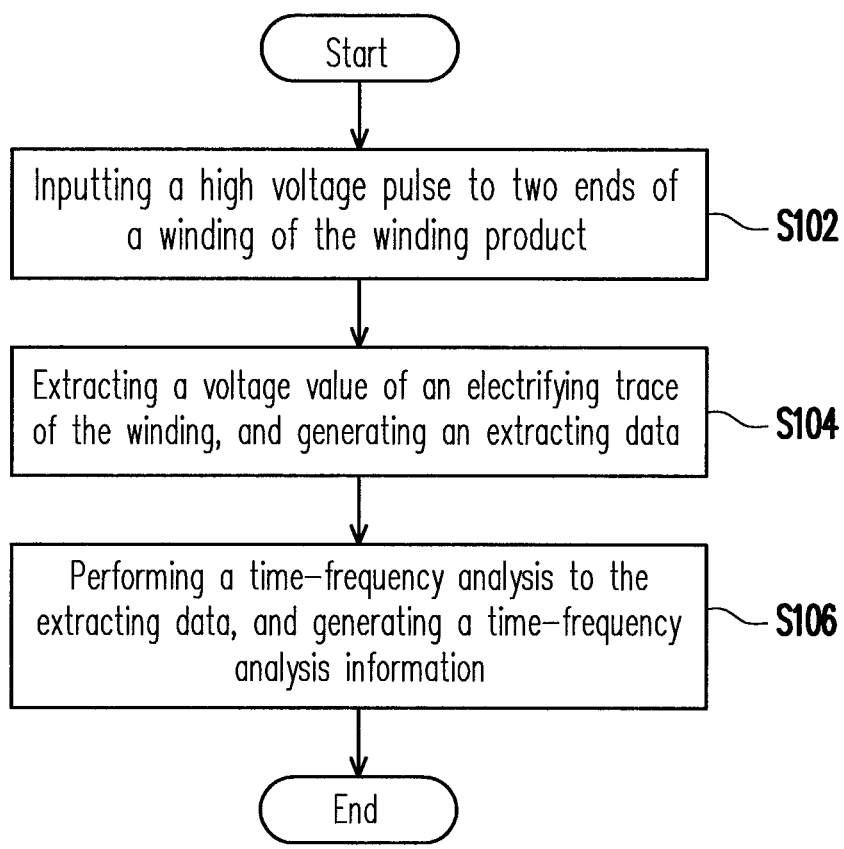
FIG. 1 is a flowchart illustrating a method for detecting an inter-turn short circuit according to an exemplary embodiment of the present invention.

FIG. 1 is a flowchart illustrating a method for detecting an inter-turn short circuit according to an exemplary embodiment of the present invention. Referring to FIG. 1, the method of the present invention is adapted to a winding product, such as a motor, a transformer, and a power generator, etc. When the winding product is detected, first, in a step S102, a high voltage pulse is input to two ends of a winding of the winding product to serve as a detecting voltage. Next, in a step S104, a voltage value of an electrifying process of the winding is extracted for generating an extracting data.

Especially, in the present embodiment, as that described in a step S106, a time-frequency converting operation can be performed to the extracting data to generate a time-frequency analysis information for indicating whether or not the inter-turn short circuit is occurred in the winding. In the present embodiment, the time-frequency converting operation is, for example, a wavelet transform operation, a short-time Fourier transform operation, or a Hilbert-Huang transformation (HHT), etc., which is not limited by the present invention.

When the high voltage pulse is exerted to the winding, if the inter-turn short circuit is occurred, a high voltage discharging phenomenon is generated between the windings, and a high frequency spectrum is accordingly generated. Therefore, a time-frequency analysis technique can be used to recognize a frequency value and a magnitude of energy generated at a certain time point, so as to determine whether or not the inter-turn short circuit is occurred in the winding. In detail, when the high voltage pulse is exerted to the winding, if the inter-turn short circuit is not occurred in the winding, in a time-frequency diagram, only regular low-energy cycle signals are shown, and there is not obvious high energy concentration. Conversely, if the inter-turn short circuit is occurred in the winding, a phenomenon of energy concentration is generated at a special time point. Therefore, any one can easily and accurately determine whether or not the inter-turn short circuit is occurred in the winding according to the time-frequency analysis information without using a signal comparison approach.

Figure 2:
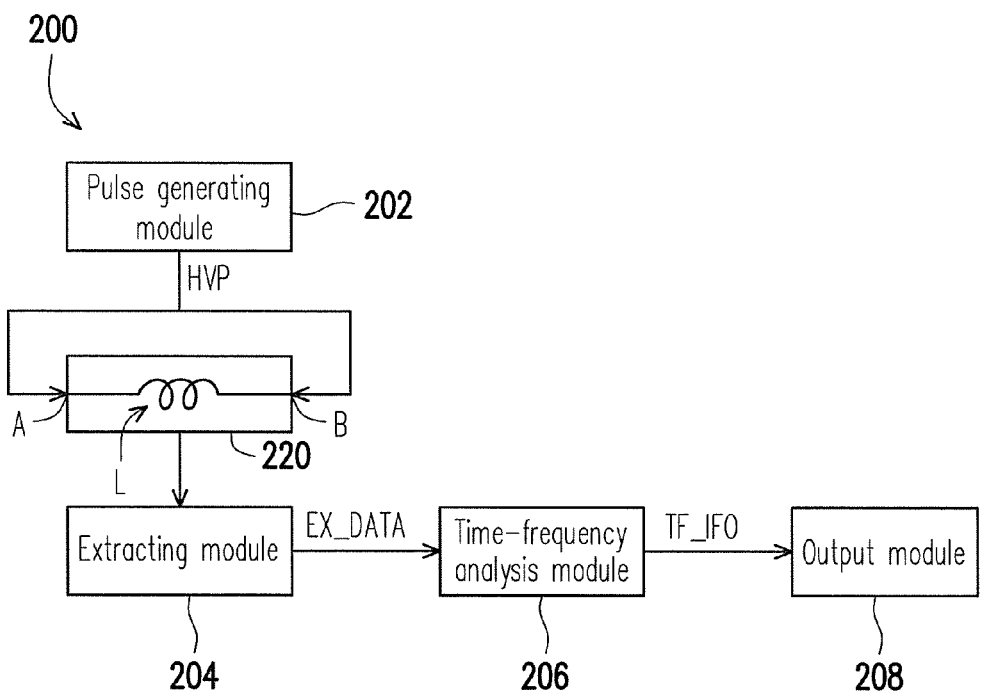
FIG. 2 is a functional block diagram illustrating a detecting station of a winding product according to an embodiment of the present invention.

FIG. 2 is a functional block diagram illustrating a detecting station of a winding product according to an embodiment of the present invention. Referring to FIG. 2, the detecting station 200 of the present embodiment includes a pulse generating module 202, an extracting module 204 and a time-frequency analysis module 206. In some selective embodiments, the detecting station 200 further includes an output module 208. The pulse generating module 202 and the extracting module 204 are coupled to a winding product 220 to be detected, which is, for example, a motor, a transformer, or a power generator, etc. Moreover, the time-frequency analysis module 206 is coupled to the extracting module 204, though in some other embodiments, the time-frequency analysis module 206 can also be coupled to the output module 208.

Referring to FIG. 2 again, in the present embodiment, the pulse generating module 202 is a power equipment, which can be coupled to two ends (A, B) of a winding (L) of the winding product 220, so as to input a high voltage pulse (HVP) into two ends (A, B) of the winding (L) of the winding product 220. Then, the extracting module 204 can extract a voltage value of an electrifying process of the winding (L), and generates an extracting data EX_DATA.

Figure 3:
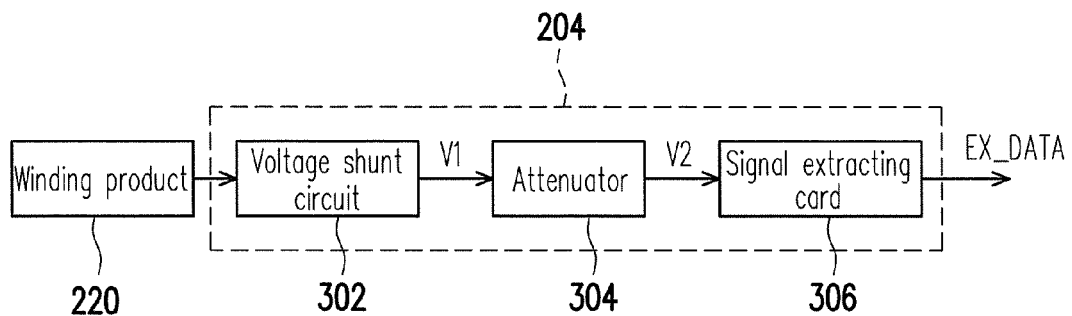
FIG. 3 is a functional block diagram illustrating an extracting module according to an exemplary embodiment of the present invention.

FIG. 3 is a functional block diagram illustrating the extracting module 204 according to an exemplary embodiment of the present invention. It should be noticed that the extracting module 204 of FIG. 3 is only an example, and the present invention is not limited thereto. Moreover, those with ordinary skill in the art should understand that any of the extracting circuits of the other known techniques can be used to replace the extracting module 204 of the present embodiment without departing from the spirit and scope of the present invention.

The extracting module 204 can include a voltage shunt circuit 302, an attenuator 304 and a signal extracting card 306. The voltage shunt circuit 302 is coupled to the winding product 220, and measures a voltage value thereof according to a voltage shunt approach, so as to generate a voltage signal V1. Wherein, a reason of using the voltage shunt approach to measure the voltage value is to avoid burning the detecting station due to the high voltage. Moreover, the attenuator 304 can further attenuate the voltage signal V1, and generates a voltage signal V2. Now, the signal extracting card 306 receives the voltage signal V2, and generates the extracting data EX_DATA according to the voltage signal V2. In other selective embodiments, the signal extracting card 306 can also directly generate the extracting data EX_DATA according to the voltage signal V1.

Referring to FIG. 2 again, after the extracting module 204 generates the extracting data EX_DATA, the extracting data EX_DATA is transmitted to the time-frequency analysis module 206 for performing a time-frequency converting operation. In the present embodiment, the time-frequency analysis module 206 can perform a wavelet transform operation, a short-time Fourier transform operation, or a Hilbert-Huang transformation (HHT), etc. to the extracting data EX_DATA, so as to generate a time-frequency analysis information TF_IFO for indicating whether or not an inter-turn short circuit is occurred in the winding.

Figure 4A:
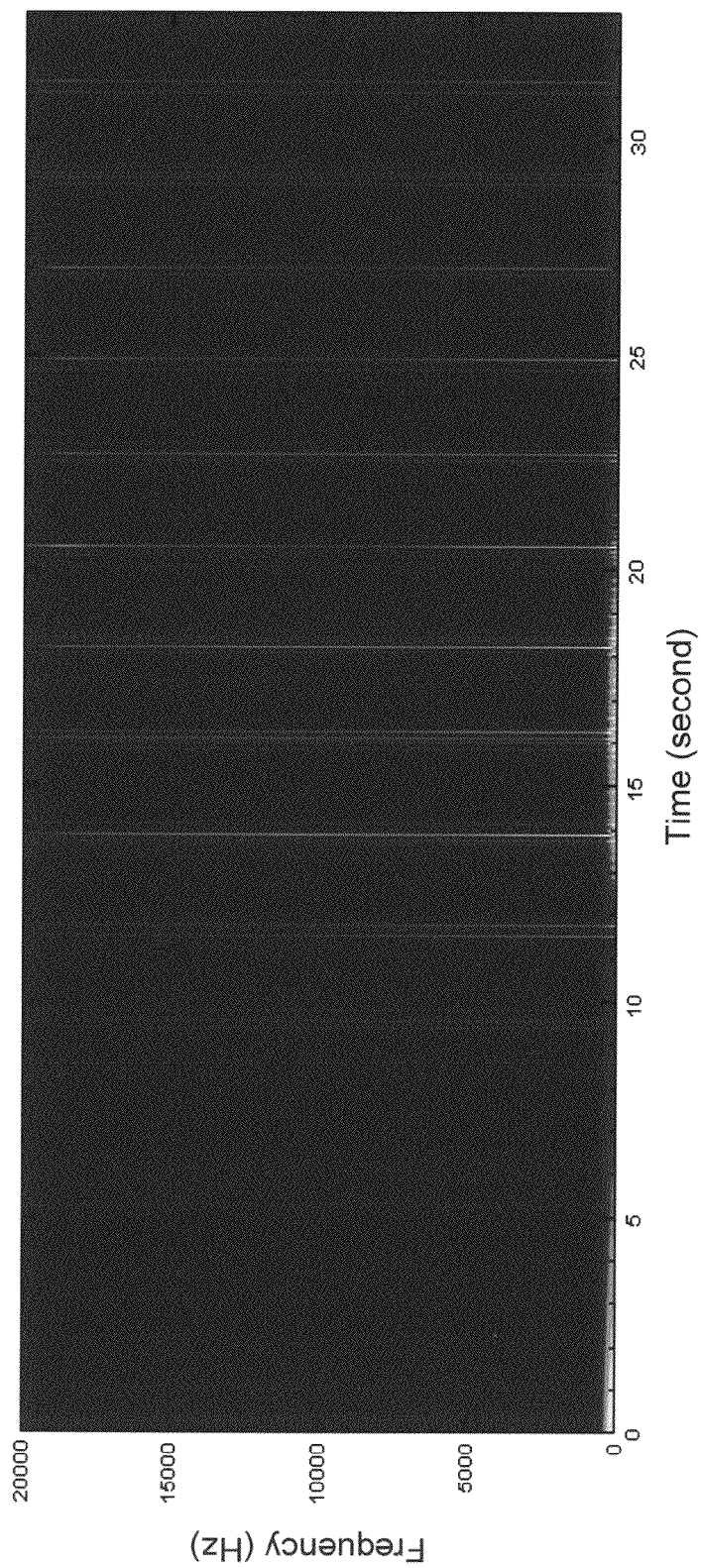
FIG. 4A and FIG. 4B are diagrams respectively illustrating a frequency and time distribution of a time-frequency analysis information in case that an inter-turn short circuit is occurred and the inter-turn short circuit is not occurred.
Figure 4B:
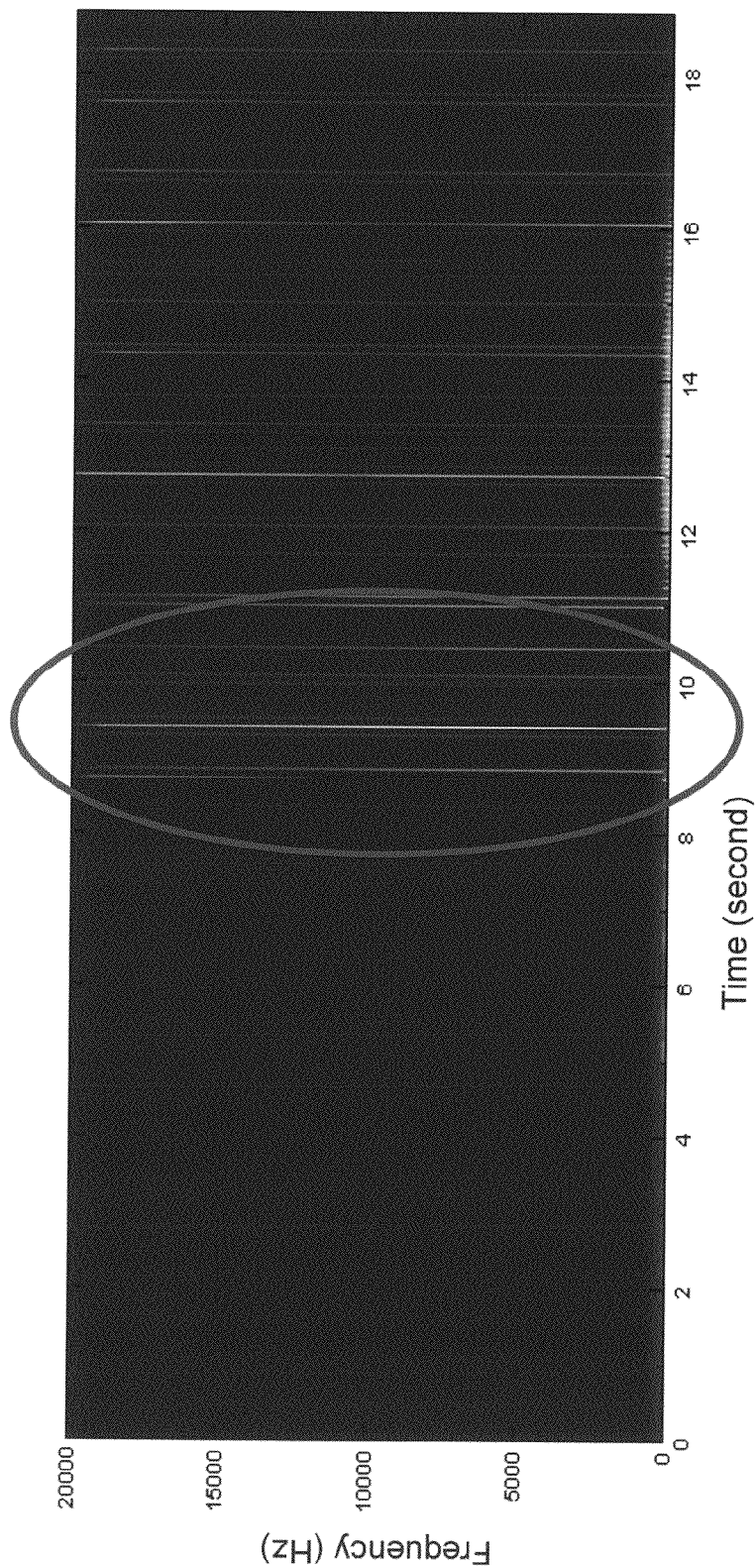

FIG. 4A and FIG. 4B are diagrams respectively illustrating a frequency and time distribution of a time-frequency analysis information in case that an inter-turn short circuit is occurred and the inter-turn short circuit is not occurred. Referring to FIG. 4A, the illustrated time-frequency analysis information is obtained from a normal winding. In the time-frequency analysis information of FIG. 4A, a horizontal axis represents time, and a unit of the time is second, while a longitudinal axis represents frequencies, and a unit of the frequency is hertz (Hz). According to FIG. 4A, it is known that if the inter-turn short circuit is not occurred in the winding, in the time-frequency analysis information, only regular low-energy cycle signals are shown, and there is not obvious high energy concentration.

Conversely, if the inter-turn short circuit is occurred in the winding, since the high voltage pulse is exerted to the winding, a high voltage discharging phenomenon is generated. Now, in the time-frequency analysis information, a phenomenon of energy concentration is generated at a special time point. For example, in FIG. 4B, the phenomenon of energy concentration is generated around a time point of 8.6 seconds (an encircled position shown in FIG. 4B). In other words, any one can determine whether or not the inter-turn short circuit is occurred in the winding by observing whether or not there is an energy concentration phenomenon at a special time point without using a professional skill.

Referring to FIG. 2 again, in the present embodiment, the time-frequency analysis information TF_IFO generated by the time-frequency analysis module 206 can be further transmitted to the output module 208. The output module 208 can be a display module, a speaker, a printer or a similar device, which can display the time-frequency analysis information TF_IFO output from the time-frequency analysis module 206. For example, the time-frequency analysis information TF_IFO is displayed on a screen of a display device, so that an inspector can inspect the information.

Figure 5:
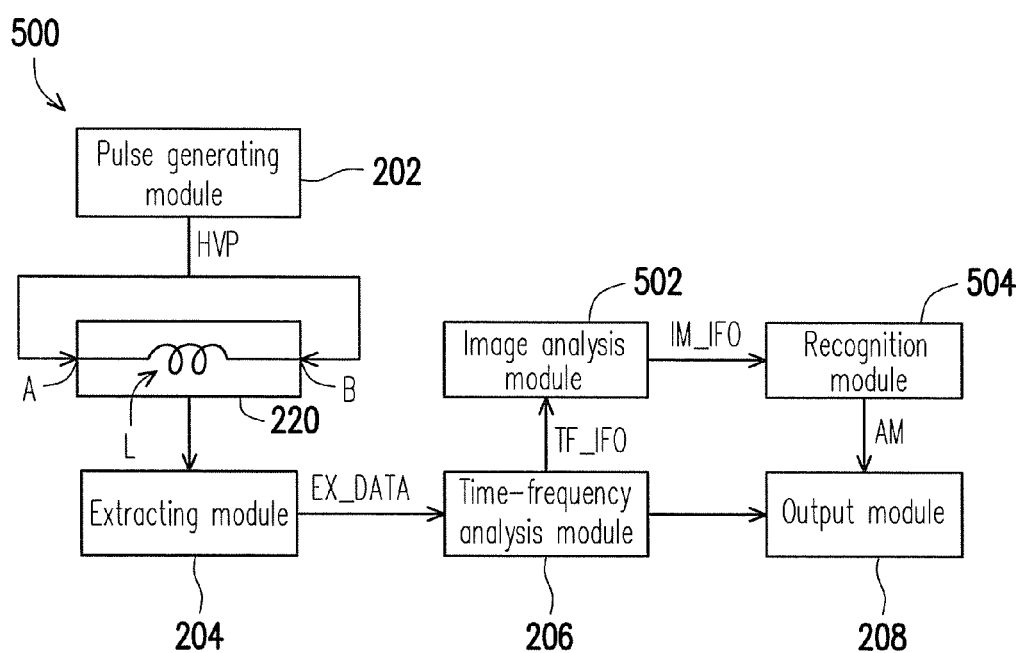
FIG. 5 is a functional block diagram illustrating a detecting station of a winding product according to another embodiment of the present invention.

FIG. 5 is a functional block diagram illustrating a detecting station of a winding product according to another embodiment of the present invention. Referring to FIG. 5, most of the functional blocks of the detecting station 500 are the same to that of the detecting station 200 of FIG. 2, so that detailed descriptions thereof are not repeated. A difference there between is that the detecting station 500 further includes an image analysis module 502 and a recognition module 504. Wherein, the image analysis module 502 is coupled to the time-frequency analysis module 206, and the recognition module 504 is coupled to the image analysis module 502. In some other embodiments, the recognition module 504 can be further coupled to the output module 208.

In the present embodiment, after the time-frequency analysis module 206 generates the time-frequency analysis information TF_IFO, it can be transmitted to the image analysis module 502. Then, the image analysis module 502 performs an image processing to the time-frequency analysis information TF_IFO to generate an image processing information IM_IFO, as that shown in FIG. 6.

Figure 6:
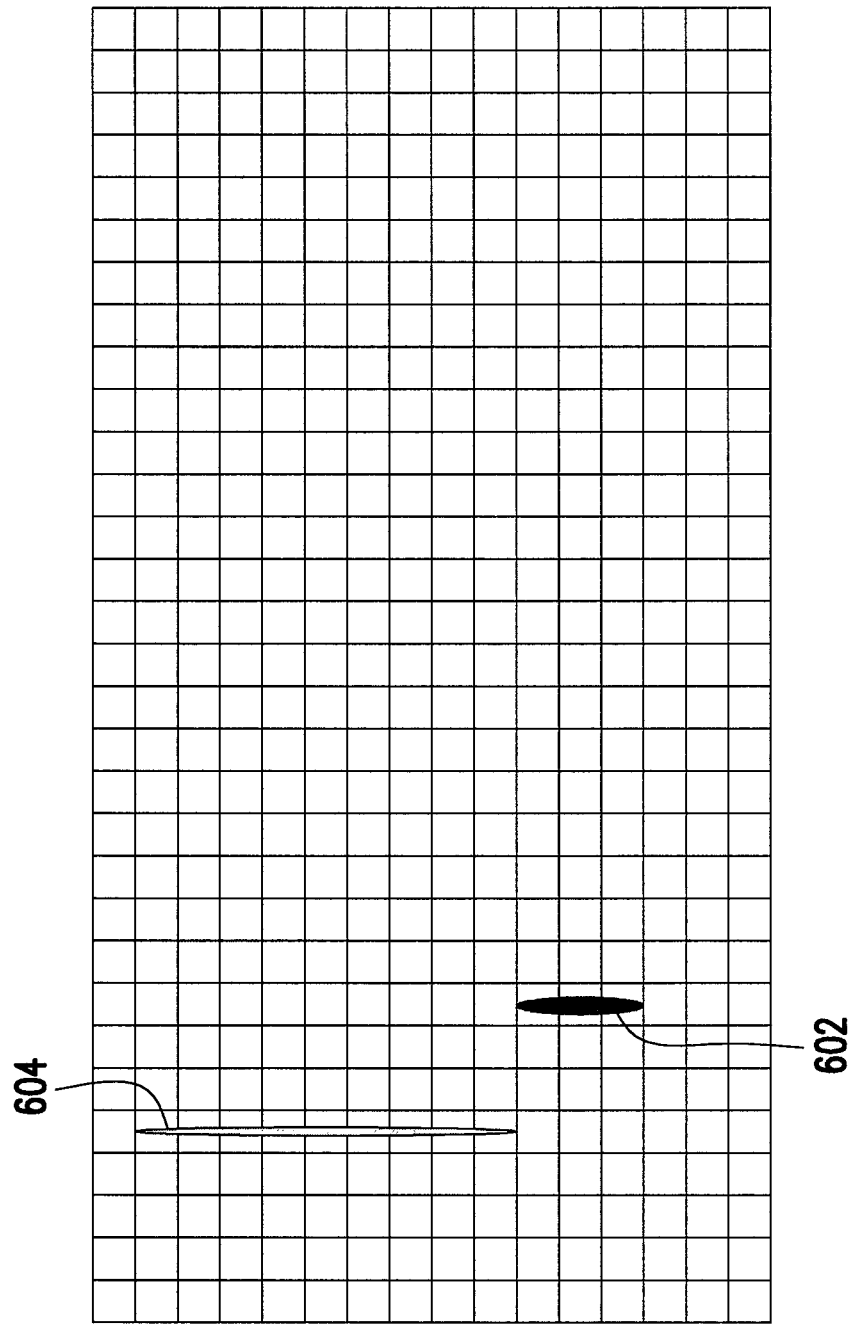
FIG. 6 is a schematic diagram illustrating an image processing information according to an embodiment of the present invention.

FIG. 6 is a schematic diagram illustrating an image processing information IM_IFO of FIG. 5 according to an embodiment of the present invention. Referring to FIG. 5 and FIG. 6, in the present embodiment, the image analysis module 502 can mesh the frequency and time distribution diagram of the time-frequency analysis information TF_IFO. In FIG. 6, an area without the energy concentration presents a white base. Comparatively, if the inter-turn short circuit is occurred in the winding, black dots (for example, black dots 602 and 604) can be displayed at a corresponding area.

After the image analysis module 502 generates the image processing information IM_IFO, the image processing information IM_IFO is transmitted to the recognition module 504 for recognizing. In the present embodiment, the recognition module 504 can perform a graphic recognition to the image processing information IM_IFO. For example, the white base area can be interpreted as data of "0", and the black dot area can be interpreted as data of "1". In some embodiments, the recognition module 504 can be implemented by a desktop computer, a laptop computer, or a portable computer, etc., and a neural network learning technique can be used to recognize the image processing information IM_IFO.

In some selective embodiments, when the recognition module 504 determines that the image processing information IM_IFO has the block dots, the recognition module 504 can send an alert message AM to the output module 208. The alert message AM is, for example, a text message which can be displayed on the screen of the output module 208, or a voice message which can be played through a speaker to warn the inspector.

In summary, in the present invention, since the information provided to the inspector is the time-frequency analysis information, any one (even someone who does not have a special expertise) can easily and accurately determine whether or not the inter-turn short circuit is occurred in the winding without using a comparison party. Therefore, a detecting reliability can be effectively improved. On the other hand, in the present invention, the time-frequency analysis is only performed to the extracting data, so that consumption of a high hardware cost and complicated operations are avoided.

Moreover, in the present invention, an image processing can be performed to the time-frequency analysis information, and the image processing information can be recognized to automatically determine whether or not the inter-turn short circuit is occurred. Therefore, the technique of the present invention can be applied to a mass production to reduce a human labour cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A detecting station of a winding product, comprising:
    a pulse generating module, coupled to the winding product to input a high voltage pulse to two ends of a winding of the winding product;
    an extracting module, coupled to the winding product for extracting a voltage value of an electrifying process of the winding according to a voltage shunt approach, and generating an extracting data; and
    a time-frequency analysis module, coupled to the extracting module for performing a time-frequency converting operation to the extracting data to obtain a time-frequency analysis information indicating whether or not an inter-turn short circuit is occurred in the winding of the winding product,
    wherein when the inter-turn short circuit is occurred in the winding of the winding product, the obtained time-frequency analysis information comprises a high frequency energy concentration at a specific time point,
    wherein when the inter-turn short circuit is not occurred in the winding of the winding product, the obtained time-frequency analysis information does not have any obvious high frequency energy concentration at any time point.

2. The detecting station as claimed in claim 1, further comprising an output module coupled to the time-frequency analysis module for outputting the time-frequency analysis information.

3. The detecting station as claimed in claim 2, wherein the output module comprises a display.

4. The detecting station as claimed in claim 1, further comprising:

an image analysis module, coupled to the time-frequency analysis module, for performing an image processing to the time-frequency analysis information and generating an image processing information; and a recognition module, coupled to the image analysis module, for recognizing the age processing information, and determining whether or not the inter-turn short circuit is occurred in the winding according to the image processing information.

5. The detecting station as claimed in claim 1, wherein the extracting module comprises:

a voltage shunt circuit, receiving a shunted voltage from the winding;

an attenuator, coupled to the voltage shunt circuit for attenuating the shunted voltage; and a signal extracting card, coupled to the attenuator for receiving an attenuated voltage signal, so as to extract the voltage value of the electrifying process of the winding.

6. The detecting station as claimed in claim 1, wherein the winding product comprises a motor, a power generator and a transformer.

7. A method for detecting an inter-turn short circuit, adapted to a winding product, the method for detecting the inter-turn short circuit comprising:

inputting a high voltage pulse to two ends of a winding of the winding product;

extracting a voltage value of an electrifying process of the winding, and generating an extracting data; and performing a time-frequency converting operation to the extracting data, and generating a time-frequency analysis information for indicating whether or not an inter-turn short circuit is occurred in the winding, wherein when the inter-turn short circuit is occurred in the winding of the winding product, the obtained time-frequency analysis information comprises a high frequency energy concentration at a specific time point, wherein when the inter-turn short circuit is not occurred in the winding of the winding product, the obtained time-frequency analysis information does not have any obvious high frequency energy concentration at any time point.

8. The method for detecting the inter-turn short circuit as claimed in claim 7, further comprising outputting the time-frequency analysis information.

9. The method for detecting the inter-turn short circuit as claimed in claim 7, further comprising:

performing an image processing to the time-frequency analysis information, and generating an image processing information;

recognizing the image processing information to determine whether or not the inter-turn short circuit is occurred in the winding; and sending an alert message when the inter-turn short circuit is occurred in the winding.

10. The method for detecting the inter-turn short circuit as claimed in claim 7, wherein the time-frequency converting operation comprises a wavelet transform operation, a short-time Fourier transform operation, and a Hilbert-Huang transformation (HHT).

* * * * *